United States Patent [19]
Korhonen

[11] Patent Number: 5,317,283
[45] Date of Patent: May 31, 1994

[54] METHOD TO REDUCE NOISE IN PLL FREQUENCY SYNTHESIS

[75] Inventor: Veijo S. Korhonen, Oulu, Finland

[73] Assignee: Nokia Mobile Phones, Ltd., Salo, Finland

[21] Appl. No.: 73,314

[22] Filed: Jun. 8, 1993

[51] Int. Cl.[5] .......................................... H03L 7/089
[52] U.S. Cl. ...................................... 331/1 A; 331/25; 331/27; 307/516; 307/528; 328/134
[58] Field of Search .......................... 331/1 A, 25, 27; 307/516, 525, 526, 528; 328/133, 134

[56] References Cited

U.S. PATENT DOCUMENTS 5,008,629 4/1991 Ohba et al. ...................... 331/25 X

FOREIGN PATENT DOCUMENTS

0435552A2 7/1991 European Pat. Off. .

Primary Examiner—Siegfried H. Grimm
Attorney, Agent, or Firm—Perman & Green

[57] ABSTRACT

A phase locked loop system including first and second counters connected respectively to first and second registers. The first register contains a number M and the second register contains a number N. The first counter is responsive to a reference signal Fref and the second counter is responsive to an output signal Fout. The first counter provides an output signal F1 responsive to M cycles of Fref and the second counter provides an output signal F2 responsive to N cycles of Fout. The F1, F2, Fref and Fout signals are connected to a phase detection circuit where the phases of Fref and Fout are compared under the control of the larger states of F1 and F2. The output signal of the phase detection circuit is connected to a voltage controlled oscillator that produces the output signal Fout proportional to the phase detection circuit output signal. The Fout signal is looped back to the second counter until the phase locked loop system settles when Fref/M equals Fout/N.

10 Claims, 3 Drawing Sheets

METHOD TO REDUCE NOISE IN PLL FREQUENCY SYNTHESIS

BACKGROUND OF THE INVENTION

Field of the Invention

The present invention relates to phase locked loop frequency synthesis for communication applications, and more particularly to phase locked loop frequency synthesizer circuits having reduced noise.

Description of the Background Art

A background reference illustrating a phase locked loop circuit is provided in European Patent Application, Publication Number 0,435,552 A2 filed Dec. 19, 1990 by Babin entitled "A PHASE LOCKED LOOP WITH REDUCED FREQUENCY/PHASE LOCK TIME". In this reference a circuit for a phase locked loop is described for providing a programmable frequency output signal with reduced phase-frequency lock time. A phase detector detects a phase difference between a reference frequency divided by a first number, and a frequency of the output signal divided by a second number. First and second counters receive the first and the second input numbers to divide a respective frequency. Whenever an input number is loaded, a load signal resets the phase detector and causes each counter to be loaded, which reduces the lock time of the loop.

SUMMARY OF THE INVENTION

Phase locked loops (PLLs) are widely employed in communication applications. One use for a PLL is as a frequency synthesizer for generating an output signal with a programmable frequency for a timer for multiple channel communication systems. With a PLL frequency synthesizer it is possible to move from one channel to another dynamically without passing through the intervening frequencies. Phase locked loop circuits incorporate phase detectors to measure a phase difference between the circuit output signal and a reference signal and adjust the output signal in response to the difference output signal of the phase detector. Phase locked loops are employed in digital cellular mobile telephone systems where it is necessary to have high performance channel switching.

An object of the present invention therefore is to provide a phase locked loop system with improved frequency synthesis.

Another object of the present invention is to provide a phase locked loop system with reduced frequency settling time.

A further object of the present invention is to provide a phase locked loop system with reduced phase jitter.

A still further object of the present invention is to provide a phase locked loop system for high performance channel switching

DESCRIPTION OF A PREFERRED EMBODIMENT

Conventional single loop frequency synthesizer circuits utilize frequency dividers wherein a reference frequency is divided by a first number and the frequency of the output signal is divided by a second number. Thus the reference frequency fref is divided by a first number M and the output signal frequency fvco is divided by a second number N.

The fref/M signal and the fvco/N signal are applied as inputs to a phase detector, the output of which is filtered and used as an input control signal to a voltage controlled oscillator which provides the single loop output signal fvco.

When the loop is balanced, the two inputs to the phase detector are equal such that fvco=fref (N/M) or fref/M=fvco/N.

Recent digital cellular mobile phone's system technology requires high channel switching performance, including a reduced settling time for the frequency synthesis. Settling time is reduced by making the loop filter bandwidth wider, but the increase in the loop filter bandwidth results in an undesired increase in the noise bandwidth at the voltage-controlled oscillator input and also an increase in the noise at the voltage-controlled oscillator output. The noise sources in the phase locked loop are due to the voltage-controlled oscillator transistors, the programmable counters, the phase detector, resistors in the loop filter and the reference frequency source.

The programmable counter noise is also referred to as phase jitter. The phase jitter in a digital signal is the variation in the time the signal edge rises or falls. The cause of the phase jitter is due to threshold voltage variations in the MOSFET gates of the system. Each digital gate adds phase jitter to the transmission signal. Thus, the way to reduce phase jitter and thereby improve switching performance is to reduce the total number of digital gates in the transmission signal path.

Figure 1:
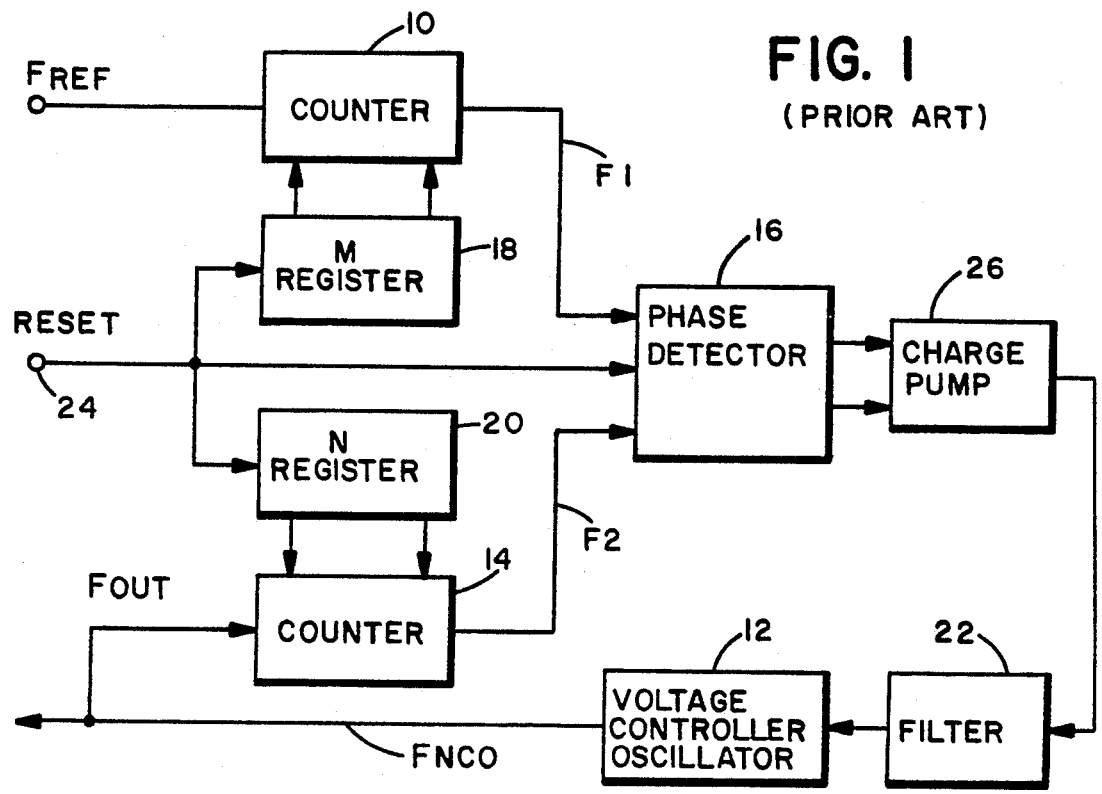
FIG. 1 is a schematic block diagram of a conventional phase locked loop circuit found in the prior art which is useful in explaining the present invention.

In prior art systems as illustrated in FIG. 1, programmable counters 10 and 14 are used to divide the reference frequency source and voltage controlled oscillator frequencies, and a phase detector 16 is used to compare the counter output phases.

Figure 2:
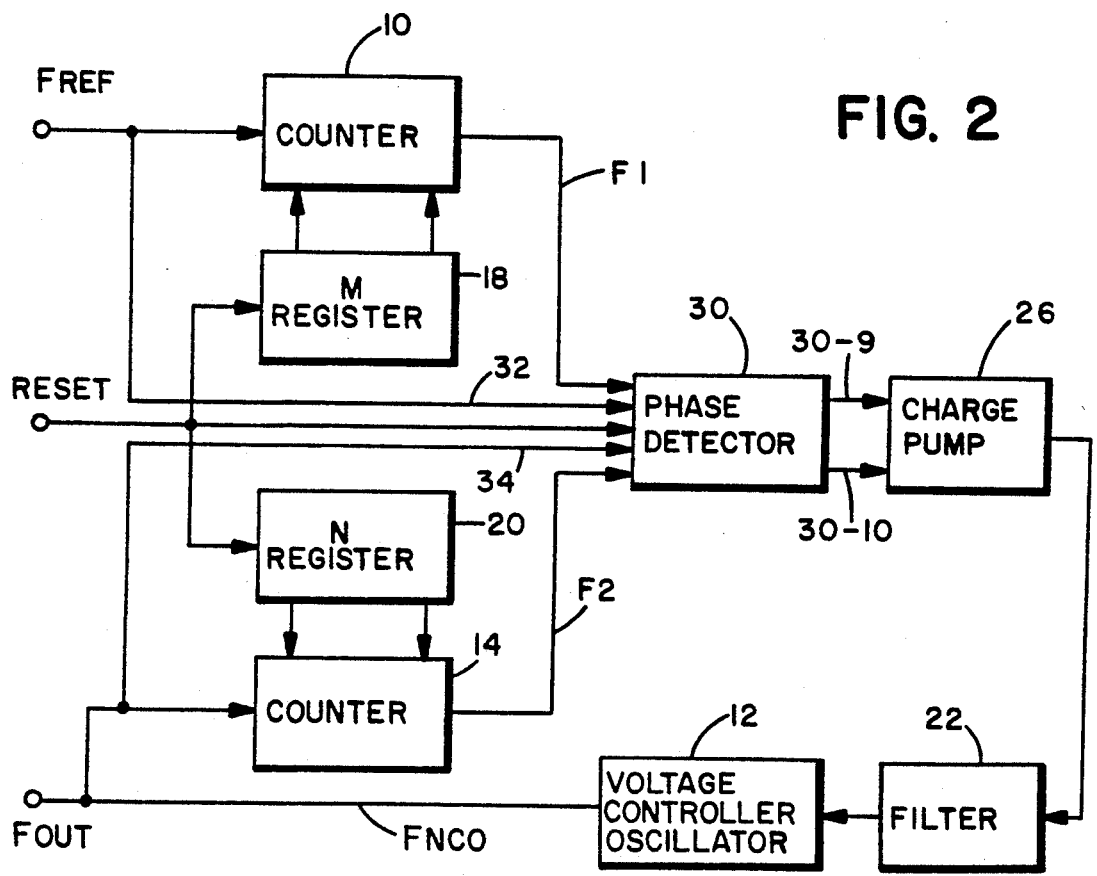
FIG. 2 is a schematic block diagram of an embodiment of an improved phase locked loop circuit according to the principles of the present invention.

In the present invention as illustrated in FIG. 2, the same reference frequency source and voltage controlled oscillator frequencies are applied to both the counters 10, 14 and to the phase detector 30 and the outputs of the counters 10, 14 are used as control signals. Thus, the phase jitter is reduced because the counters do not add any phase jitter to the phase compared signals. The phases that the phase detector 30 compares are actually the reference voltage and voltage controlled oscillator phases and not the counter output as in FIG. 1.

Referring to FIG. 1, a typical prior art phase locked loop circuit is shown including a counter 10 and its associated M register 18 and a counter 14 and its associated N register 20. The outputs of counters 10 and 14 are applied as inputs to a phase detector 16. The output signal from the phase detector 16 is passed through filter 22 to a voltage controlled oscillator 12. The output signal from the voltage controlled oscillator 12, which is the circuit output signal, is fed back to counter 14. A system reset signal is applied to registers 18 and 20 and phase detector 16 at input 24. The purpose of the circuit of FIG. 1 is to provide an output frequency signal Fout which is equal to a reference signal Fref (N/M) where M and N are integers. Thus Fref/M equals Fout/N and Fout equals Fref (N/M).

In operation, the number M from register 18 is applied to counter 10 and the number N from register 20 is applied to counter 14. The signal Fref is applied to counter 10 which passes Fref for a number of cycles equal to a count of M, so that a signal F1 is provided at the output of counter 10 which is in a first state, that is "low" for M-1 cycles of Fref, and otherwise in a "high" state. The value or number M, provided by register 18 to counter 10 causes counter 10 to decrement from M to O during which the total number of M cycles of Fref are applied as signal F1 to phase detector 16.

An output signal Fout is obtained from the Fnco output signal from voltage controlled oscillator 12. The Fnco signal is applied to counter 14 which decrements from N to O such that a number of N cycles of Fnco are applied to phase detector 16 as signal F2. Thus signal F2 is provided which is in a first state, that is "low" for N-1 cycles of Fnco and otherwise in a "high" state. The signals F1, which is the equivalent of Fref/M and the signal F2 which is the equivalent of Fout/N are sent to phase detector 16 which provides an "UP" signal when the F2 signal edge rises before the F1 signal edge, and a "DOWN" signal when the F1 signal edge rises before the F2 signal edge. The "Up" or "Down" signals from phase detector 16 are applied to an FET push-pull (charge pump) circuit 26 which provides a PDout signal to voltage controlled oscillator 12 through filter 22. The output signal Fnco from voltage controlled oscillator 12 will increase or decrease in response to the PDout signal from phase detector 16 and FET circuit 26. The increased (or decreased) Fnco signal is sent as Fout back to counter 14 and the circuit continues operation until Fout/N equal Fref/M and the loop is settled. In the circuit of FIG. 1 there are many gates in the signal path, and there is asynchronous phase detection, resulting in undesired noise.

Referring to FIG. 2 a first embodiment of the invention is shown. In FIG. 2 the same counters 10, 14, registers 18, 20, filter 22, and voltage controlled oscillator 12 may be employed.

The input Fref signal is also connected directly to a phase detector 30 which differs from phase detector 16 of FIG. 1. The Fout signal from voltage controlled oscillator 14 is also connected to phase detector 30 along with the F1 signal from counter 14 and the reset signal. The F1 signal, which is equal to M cycles of Fref, and the F2 signal which is equal to N cycles of Fout are also phase detected with Fref signal applied directly to phase detector 30 on lead 32 and the Fout signal applied directly to phase detector 30 on lead 34.

With the inputs F1, Fref, F2 and Fout, the phase detector 30 performs the following function. In FIG. 1 it is noted that F1 and F2 are the output signals from a counter and therefor are noisy due to the gates within the counters that add to the system phase jitter.

In FIG. 2 however, the Fref and the Fout signals themselves are used as input signals to phase detector 30, and the F1 and F2 signals that include the counter noise are used only as control signals. Thus, the phases the phase detector 30 compare are actually the reference Fref and output Fout phases and not the counter 10 and counter 14 phases.

Figure 4:
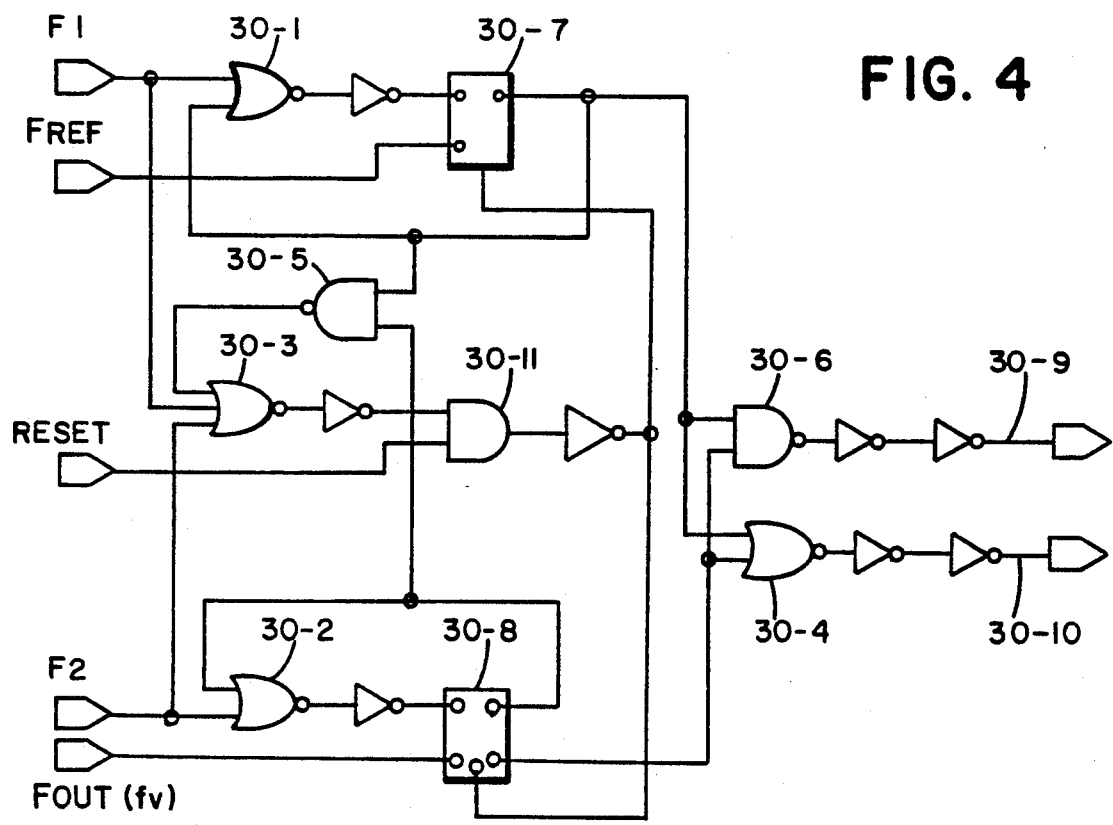
FIG. 4 is a schematic circuit diagram of a phase detector device which may be employed in the system of FIG. 2 and 3.

Referring to FIG. 4, a more detailed circuit diagram of phase detector 30 is shown including the five input leads for the F1, Fref, Reset, F2 and Fout signals. The circuit of FIG. 4 incorporates logic elements including NOR circuits 30-1, 30-2, 30-3 and 30-4, NAND circuits 30-5, 30-6 and D-flip-flops 30-7 and 30-8. The actual Fref and Fout signals are applied to D-flip-flops 30-7 and 30-8 respectively where they are clocked by the F1 and F2 signals from OR circuits 30-1 and 30-2, respectively. The outputs of the differential amplifiers 30-7 and 30-8 are applied to both NOR gates 30-4 and 30-6 and an UP or DOWN signal appears at the two output leads 30-9 and 30-10 of the phase detector depending on whether the Fout frequency is too low and needs to go UP, or vice versa. The UP and DOWN output signals from phase detector 30 are active between the rising (falling) edges of F1 and F2. If F1 occurs first then Fout is too low and needs to go up. If F2 occurs first, then Fout is too high and needs to go down. The reset signal is applied through NAND gate 30-11 to reset the D-flip-flops 30-7 and 30-8.

Figure 3:
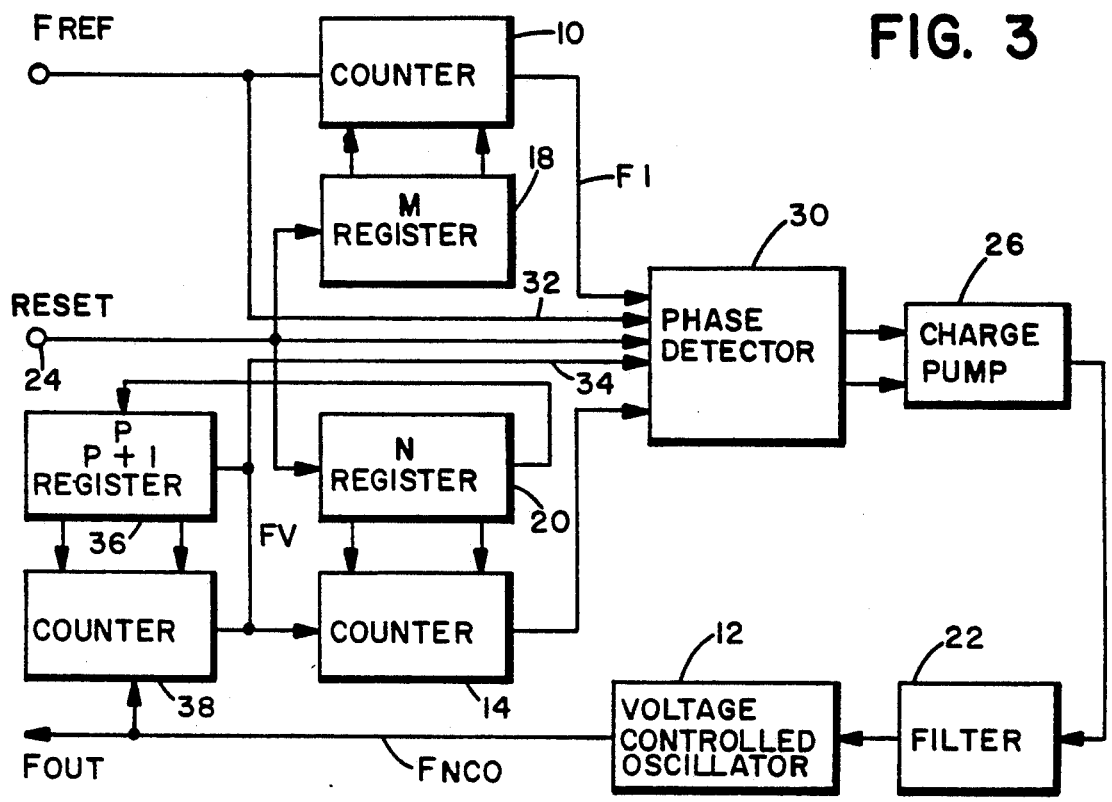
FIG. 3 is a schematic block diagram of another embodiment of an improved phase locked loop circuit similar to the circuit shown in FIG. 2.

Referring to FIG. 3 another embodiment of the invention is shown which is similar to the circuit of FIG. 2 but with the addition of a P, P+1 counter 38 (prescaler), Counter 38 is used when the frequency Fnco is so high that the counter 14 is not able to operate at such high frequency. In this event a high frequency prescaler circuit is required. The prescaler circuit is a state of the art device which uses a synchronous front divider and an asynchronous back divider to establish a commonly known dual modulus prescaler circuit. P or P+1 is the number used depending on the modulus state (0 or 1).

Figure 5:
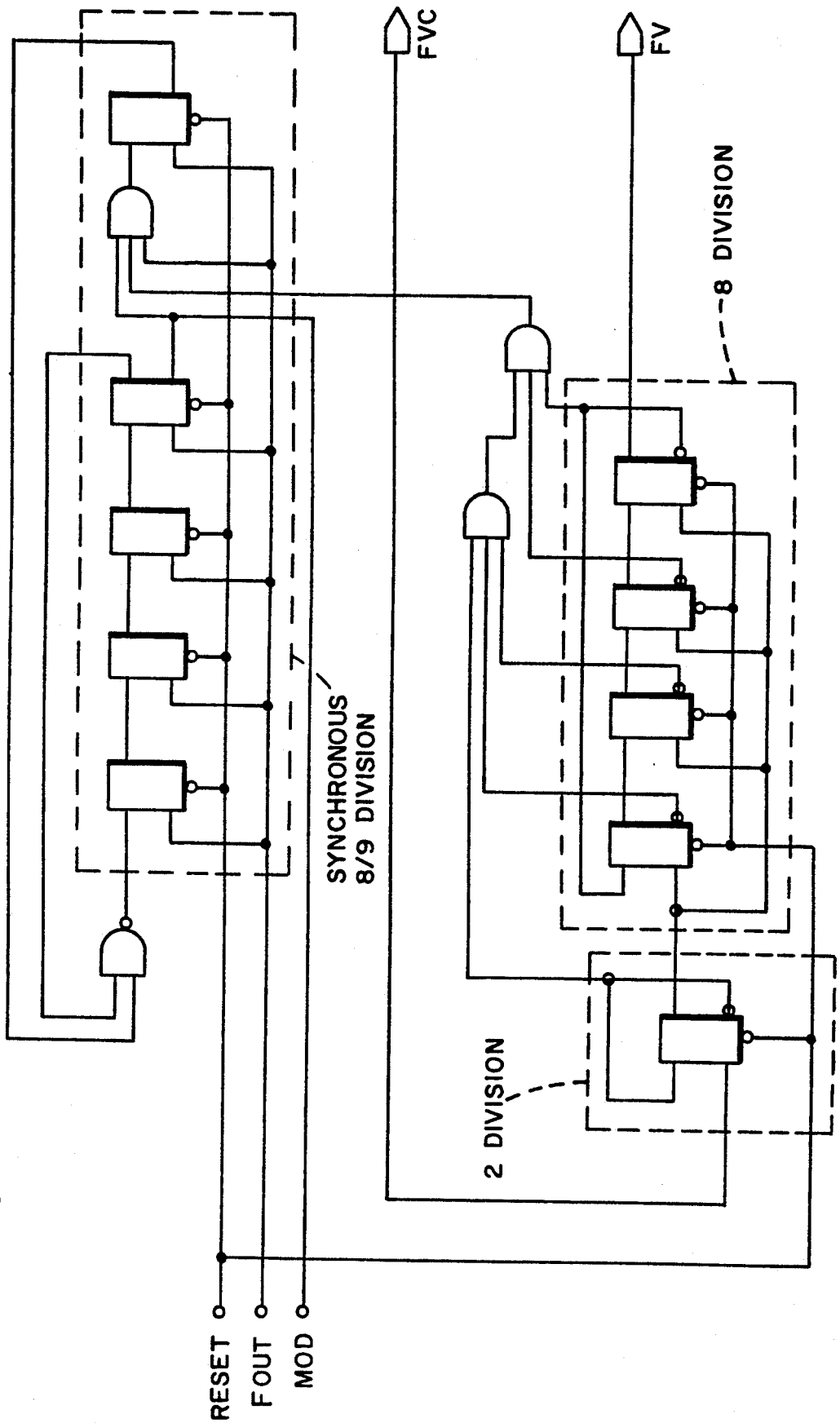
FIG. 5 is a schematic circuit diagram of a prescaler device which may be employed in the system of FIG. 3.

Referring to FIG. 5, a schematic circuit diagram is illustrated for a dual modulus prescaler which may be employed in the present invention. The dual modulus prescaler may be the device manufactured by Motorola Inc. and specified as the MC12052A/MC12052B 1.1 GHz Low Power Dual Modulus Prescaler. In FIG. 5 the circuit inputs are the Reset signal, the Fnco signal and a mod signal. The outputs are FV and FVC. For MOD=0 then FVC=Fvco/8 and for MOD=1 then FVC=Fvco/9. It is preferred to use FVC instead of FV because it includes less phase jitter than FV.

What has been described is an improved phase locked loop system wherein the reference signal and the output signal are directly connected to the phase detection circuit to be phase detected, and the noisy output signals from the system counters are used at the phase detection circuit only as control signals.

While the invention has been described in connection with a preferred embodiment, it is intended to cover such alternatives, modifications, and equivalence as may be included within the spirit and scope of the invention as defined in the appended claims.

I claim:

1. A phase locked loop circuit comprising:
   storing means for storing first and second predetermined numbers,
   counting means connected to said storing means for providing a first signal in response to counting substantially said first predetermined number of cycles of a reference signal and for further providing a second signal in response to counting substantially said second predetermined number of cycles of an output signal, phase detection means connected to said first and second signals of said counting means, to said reference signal and to said output signal wherein said reference signal is controlled by said first counting means signal and said output signal is controlled by said second counting means signal for providing a phase difference signal in logic state between said reference signal and said output signal, and loop means connecting said phase detection means and said counting means for providing said output signal having a frequency proportional to said phase difference signal logic state.

2. A phase locked loop circuit according to claim 1 wherein said counting means changes said second signal in response to said output signal until said phase difference signal indicates no phase difference.

3. A phase locked loop system according to claim 1 wherein said storing means includes a first storage means for storing a first numerical value M; and a second storage means for storing a second numerical value N, wherein said counting means includes a first counter means responsive to an input reference signal Fref and connected to said first storage means, a second counter means responsive to an output signal Fout and connected to said second storage means, said first counter means providing an output signal F1 in response to M cycles of said reference signal Fref, said second counter means providing an output signal F2 in response to N cycles of said output signal Fout, and wherein said phase detection means is connected to said first and second counter means and responsive to said output signal F1, said reference signal Fref, said output signal F2 and said output signal Fout whereby the phases of said reference signal Fref and said output signal Fout are compared for time periods controlled by said output signals F1 and F2 for providing a phase detect output signal PDout in response to a difference in rising and falling edges of said Fref and Fout signals.

4. A phase locked loop system according to claim 3 further including a voltage controlled oscillator means connected to said phase detection means for providing said output signal Fout having a frequency proportional to said phase detect output signal PDout.

5. A phase locked loop circuit according to claim 4 wherein said phase detection means provides a first logic state signal when said Fref signal controlled by said F1 signal is in a first logic state for a longer time than said Fref signal, and wherein said phase detection means further includes a push-pull circuit responsive to said first and second logic signals for producing said phase detect logic signal PDout.

6. A phase locked loop circuit according to claim 5 wherein said first logic state is a low state.

7. A phase locked loop circuit according to claim 5 further including a filter means disposed between said phase detection means and said voltage controlled oscillator means for providing a filtered voltage signal to said voltage controlled oscillator means proportional to the logic state of said PDout signal, and wherein said voltage controlled oscillator means provides said output signal Fout having a frequency proportional to said voltage of said filtered signal.

8. A phase locked loop circuit according to claim 4 wherein said output signal Fout from said voltage controlled oscillator is coupled to said second counter means to provide an adjusted value of signal F2 until the signal Fref divided by M is equal to signal Fout divided by N.

9. A phase locked loop circuit according to claim 4 further including a third P, P+1 counter, said third counter being connected between said voltage controlled oscillator means and said second counter means, such that said frequency of said Fout signal from said voltage controlled oscillator means is proportionally scaled down to a related frequency.

10. A phase locked loop circuit according to claim 4 wherein first counter means, said second counter means and said phase detection means are further responsive to a reset signal for resetting said system.

* * * * *